United States Patent [19]

Iwasawa et al.

[11] Patent Number: 5,134,054
[45] Date of Patent: Jul. 28, 1992

[54] POSITIVE-TYPE PHOTOSENSITIVE ELECTRODEPOSITION COATING COMPOSITION AND PROCESS FOR PRODUCING CIRCUIT PLATE

[75] Inventors: Naozumi Iwasawa; Junichi Higashi, both of Hiratsuka, Japan

[73] Assignee: Kansai Paint Co., Ltd., Hyogo, Japan

[21] Appl. No.: 476,543

[22] Filed: Feb. 7, 1992

[51] Int. Cl.$^5$ .................. G03C 1/52; G03F 7/022; G03F 7/26
[52] U.S. Cl. .................. 430/192; 430/189; 430/193; 430/318; 430/319; 430/326
[58] Field of Search .............. 430/318, 319, 166, 190, 430/192, 193, 326, 165, 189

[56] References Cited

U.S. PATENT DOCUMENTS

| | | | |
|---|---|---|---|
| 4,289,838 | 9/1981 | Rowe et al. | 430/192 |
| 4,632,900 | 12/1986 | Demmer et al. | 430/190 |
| 4,975,351 | 12/1990 | Akaki et al. | 430/192 |

FOREIGN PATENT DOCUMENTS

| | | |
|---|---|---|
| 0194824 | 9/1986 | European Pat. Off. |
| 0315165 | 5/1989 | European Pat. Off. |
| 0354018 | 2/1990 | European Pat. Off. |

*Primary Examiner*—Marion E. McCamish
*Assistant Examiner*—Kathleen Duda
*Attorney, Agent, or Firm*—Wenderoth, Lind & Ponack

[57] ABSTRACT

A positive-type photosensitive electrodeposition coating composition comprising
(A) a photosensitive compound having a molecular weight of less than 6,000 and containing at least one modified quinonediazidesulfone units represented by the following formula (I)

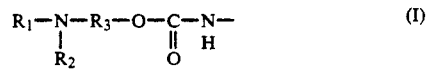

wherein
$R_1$ represents

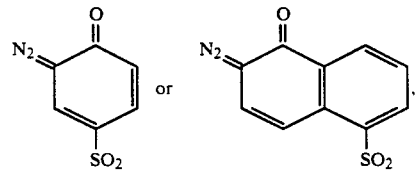

$R_2$ represents a hydrogen atom, an alkyl group, a cycloalkyl group or an alkyl ether group, and
$R_3$ represents an alkylene group, a cycloalkylene group or an alkylene ether group,
in the molecule and
(B) an acrylic resin having a salt-forming group.

16 Claims, No Drawings

POSITIVE-TYPE PHOTOSENSITIVE ELECTRODEPOSITION COATING COMPOSITION AND PROCESS FOR PRODUCING CIRCUIT PLATE

This invention relates to a positive-type photosensitive electrodeposition coating composition, and more specifically, to an anionic or cationic electro-deposition coating composition suitable for forming a printed wiring photoresist by coating an electrically conductive material-clad laminated plate by electro-deposition to form a non-tacky smooth film whose portion exposed to actinic rays such as ultraviolet light through a positive photomask can be washed away with a developing solution.

In the prior art, a printed wiring board for use in an integrated circuit or the like is formed by plating a laminated plate obtained by cladding ar insulator with an electrically conductive material such as a copper foil, laminating a photosensitive film, overlaying a photographic negative on it, exposing the photosensitive film through the negative, removing the unexposed portion, etching away the unnecessary electrically conductive material from the circuit pattern, and thereafter removing the photosensitive film on the circuit pattern. Since the photosensitive film is generally as thick as 50 micrometers, the circuit pattern formed by exposure and development is not sharp, and moreover, it is difficult to laminate the photosensitive film uniformly to the surface of the electrically conductive material. In particular, it is almost impossible to protect the metal on through-hole portions with the photosensitive film.

A method is also known to form a circuit pattern for printed wiring which comprises applying an etchinq resist ink to a metal-clad laminated plate having a through-hole portion by screen printing, etching the laminated plate to remove copper from the non-printed portion, and removing the resist ink in the printed portion. According to this method, the ink is difficult to coat on the through-hole portion, and the metal in the through-hole portion is frequently removed by the etching treatment. To avoid this, it is also the practice to embed an organic material in the through-hole portion so as to prevent the metal in the through-hole portion from being removed by the etching treatment, and finally remove the organic material. This method, however, has the defect that the cost of the circuit plate finally obtained is high and the circuit pattern has low sharpness.

As improvements over these prior methods, U.S. Pat. Nos. 4,632,900 and 4,673,458 disclose a method which comprises forming a positive-type photosensitive resin resist on a printed wiring board, overlaying a photographic positive on it, exposing the board through the positive, and removing the exposed portion with an aqueous alkaline solution to form an image. Since according to this method, a coating can be formed easily on the through-hole portion by electrodeposition and the unexposed portion remains as a resist coating, a printed wiring board having excellent resolution can be obtained.

In the above-cited U.S. Pat. No. 4,632,900, polyoxymethylene polymer, o-nitrocarbinol ester, o-nitrophenyl acetal, and a quinonediazidesulfonyl ester of novolak resin are used as the resin in the resin composition for forming the photosensitive resin resist by electrodeposition. In U.S. Pat. No. 4,673,458, a resin obtained by esterifying a hydroxyl group contained in an unsaturated monomer with a sulfonic acid group contained in naphthoquinone diazidesulfonic acid, and copolymerizing the resulting unsaturated monomer with another unsaturated monomer is used as the above resin. However, the former method cannot produce a high-density fine pattern circuit board of sufficient reliability whichever resin may be used. Moreover, since the electrodeposition paint has insufficient stability, flocculation is liable to occur and tends to cause filter clogging or imperfections on the coated surface upon long-term running of the electrodeposition bath. In the latter method, a photosensitive naphthoquinone diazide group is introduced into the resin through a sulfonic acid ester group. Hence, when the electrodeposition is carried out over a long period of time (the turnover of the electrodeposition paint is long), the ester group in the resin is easily hydrolyzed by a hydrolytic substance such as water, an acid, a base or an alcohol to degrade the resin frequently. As a result, the resin component flocculates in the electrodeposition bath or precipitates at the bottom of the bath. This causes filter clogging or greatly varied the electrodeposition characteristics such as application voltage. Alternatively, abnormal electrodeposition such as pinholing occurs, and the electrodeposition coating bath becomes difficult to control. Moreover, the coated film formed from the electrodeposition bath has poor smoothness and alkali developability, and it is impossible to obtain a printed wiring board having excellent resolution.

It is an object of this invention to solve the aforesaid problems in the preparation of painted wiring boards, and to provide an electerodeposition coating composition for forming a positive photoresist, which has excellent sensitiveness to actinic rays such as ultraviolet light, can form a developable uniform coated film on the surface or the through-hole portion of the circuit plate, and can give an electrodeposition coating bath having good stability over a long period of time.

According to this invention, there is provided a positive-type photosensitive electrodeposition coating composition comprising (A) a photosensitive compound having a molecular weight of less than 6,000 and containing at least one modified quinonediazidesulfone unit represented by the following formula (I)

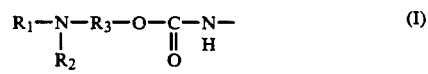

wherein $R_1$ represents

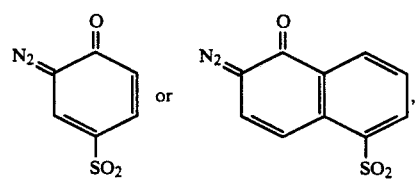

$R_2$ represents a hydrogen atom, an alkyl group, a cycloalkyl group or an alkyl ether group, and
$R_3$ represents an alkylene group, a cyclo-alkylene group or an alkylene ether group,
in the molecule and
(B) an acrylic resin having a salt-forming group.

The "alkyl group" for $R_2$ in formula (I) may be linear or branched, and examples include methyl, ethyl, n-propyl, isopropyl, n-butyl, isobutyl, sec-butyl, tert-o butyl, n-pentyl, isopentyl, tert-pentyl, neopentyl, n-hexyl, isohexyl, 1-methylpentyl, 2-methylpentyl, n-heptyl, 5-methylhexyl, n-octyl, n-nonyl, n-decyl, dodecyl, tridecyl and tetradecyl groups.

Examples of the "cycloalkyl group" are cyclo-propyl, cyclobutyl, cyclohexyl,

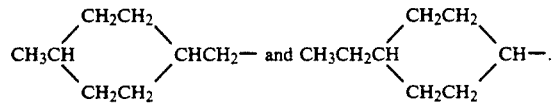

Examples of the "alkylether group" include $CH_3OCH_2-$, $CH_3CH_2-O-CH_2CH_2-$, $CH_3CH_2CH_2-O-CH_2CH_2CH_2-$ and

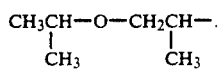

$R_2$ is preferably an alkyl group having 1 to 6 carbon atoms, especially a methyl group.

The "alkylene group" for R may be linear or branched. Examples include $-CH_2-$, $-CH_2CH_2-$, $-CH_2CH_2CH_2-$,

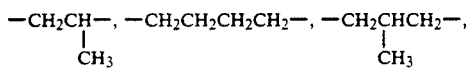

$-CH_2CH_2CH_2CH_2CH_2-$ and $-CH_2CH_2CH_2CH_2CH_2-$.

Examples of the "cycloalkylene group" include cyclopropylene, cyclobutylene, cyclohexylene and

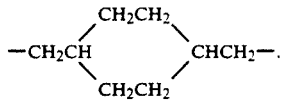

Examples of the "alkylene ether group" are $-CH_2CH_2-O-CH_2CH_2-$, $-CH_2CH_2CH_2-O-CH_2CH_2CH_2-$, and

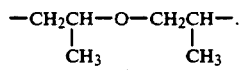

$R_3$ is preferably a linear alkylene group having 2 to 6 carbon atoms.

The positive-type photosensitive electro-deposition coating composition of this invention includes anionic or cationic compositions capable of forming a continuous film on an electrically conductive material by electrodeposition. When the continuous film is exposed, the exposed portion can be washed away with a developing solution.

The compound (A) containing the modified quinonediazidesulfone units of general formula (I) used as a positive-type photosensitive component can be produced, for example, by the following methods.

First, a hydroxyl-containing quinonediazide compound represented by the following formula

wherein $R_1$, $R_2$ and $R_3$ are as defined above, is produced by addition-reaction between quinone-diazidesulfonic acid and/or a quinonediazidesulfonyl halide (to be referred to as the "quinonediazide compound") represented by the following formula

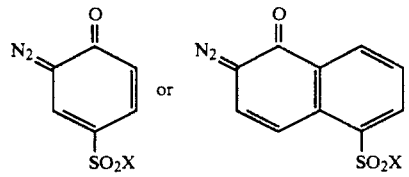

wherein X represent a hydrogen atom or a
halogen atom such as Cl, F, Br and I, and a hydroxyl-containing amine compound of the following formula

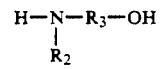

wherein $R_2$ and $R_3$ are as defined above. Then, the resulting hydroxyl-containing quinonediazide compound of formula (V) is reacted with a polyisecyanate compound, or said hydroxyl-containing quinonediazide compound of formula (V) and the diisocyanate compound are reacted at a ratio of about 2 moles of the isocyanate group, per mole of hydroxyl and the thus obtained isocyanate group-containing quinonediazide compound is reacted with a hydroxyl-containing compound.

Of the quinonediazide compounds of formula (II) or (III), 1,2-benzoquinonediazidesulfonyl chloride and 1,2-naphthoquinonediazide-5-sulfonyl chloride are preferred. Examples of preferred hydroxyl-containing amine compounds (4) include ethanolamine, neopentanolamine, 2-hydroxy-2'-aminoethyl ether, 2-hydroxy-2'-(amine-propoxy)ethyl ether, N-methylethanolamine, N-ethyl-ethanolamine, N-propylethanolamine, N-methylpropanol-amine, N-ethylpropanolamine, and N-propylpropanolamine. Of these, N-methylethanolamine and N-methylpropanolamine are preferred.

The reaction of the quinonediazide compound of formula (II) or (III) with the hydroxyl-containing amine compound of formula (IV) may be carried out in the presence of an inert organic solvent capable of dissolving or dispersing a mixture of the compound of formula (II) or (III) and the compound of formula (VI) at a temperature of generally room temperature to about 80° C., preferably room temperature to about 60° C., for a period of about 10 minutes to about 60 hours, preferably about 1 to 3 hours. The progress of the reaction can be monitored by measuring the amine value of the reaction mixture or by an infrared spectrum analysis.

Specific examples of the inert organic solvent that can be used in the above reaction include dioxanes such as dioxane and dioxolane; ketones such as acetone, methyl ethyl ketone and methyl isobutyl ketone; and aromatic hydrocarbons such as benzene, toluene and xylene. Of these, the dioxanes are preferred because they have an excellent ability to dissolve the quinonediazidesulfonyl halide and can be easily removed.

The ratio of the compound (II) or (III) and the compound of formula (IV) mixed is not particularly limited. Usually, it is suitable to mix them so that the mole ratio of the —SO₂X group to the >NH is about 1:1. In the above reaction, the —SO₂X group of the quinone-diazide compound reacts with the >NH group of the hydroxyl-containing amine compound preferentially to the OH group. Hence, the main reaction product obtained by this reaction is the hydroxyl-containing quinonediazide compound represented by formula (V).

Preferred examples of the compound of formula (V) are given below.

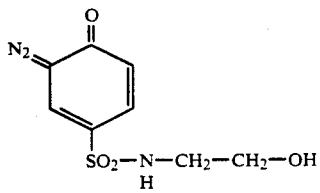

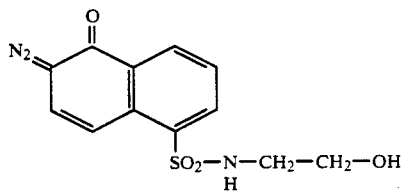

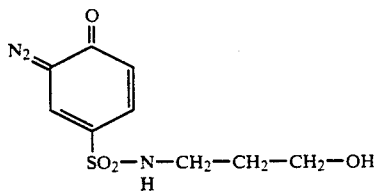

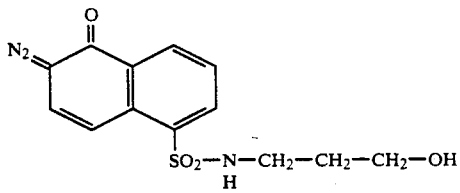

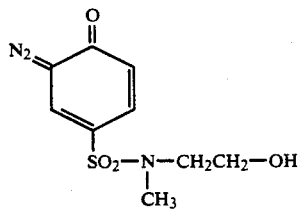

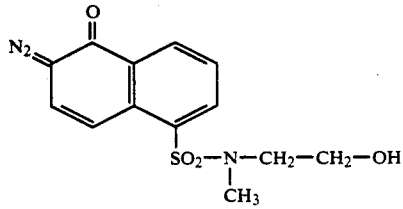

-continued

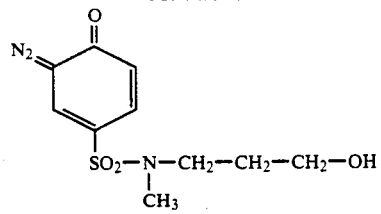

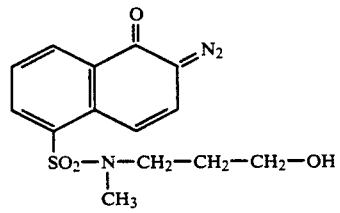

Examples of the polyisecyanate compound that can be reacted with the hydroxyl-containing quinone-diazide compound of formula (V) are tolylene diisocyanate, methylcyclohexane 2,4-(or 2,6-)diisocyanate, 1,3-diisocyanate methylcyclohexane, 1,6-hexameth),lene diisocyanate, 4,4'-diphenylmethane diisocyanate, 4,4'-diphenylether diisocyanate, phenylene diisocyanate, naphthalene diisocyanate, biphenylene diisocyanate, 3,3'-dimethyl-4,4'-biphenylene diisocyanate, dicyclohexylmethane-4,4'-diisocyanate, p-xylylene diisoeyanate, m-xylylene diisocyanate, bis(4-isocyanatephenyl)-sulfone, isopropylidenebis(4-phenylisocyanate), lysine diisocyanate and isophorone diisocyanate. Moreover, allophanates, phanates, cyanurates and polyol partial addition products of these polyisocyanate compounds are also available.

The reaction of the polyisocyanate compound with the hydroxyl-containing quinonediazide compound (V) may be carried out, for example, by maintaining these compounds in an isocyanate/hydroxyl mole ratio of about 1:1 in an inert organic solvent as required at a temperature of room temperature to about 80° C., preferably room temperature to about 60° C. for about 0.5 to 20 hours. The reaction can be monitored by measuring the isocyanate group in the vicinity of 2250 cm⁻¹ by infrared spectroscopy. The inert organic solvent may be one which does not react with the isocyanate group and the hydroxyl group, such as ketones, esters, aromatic hydrocarbons, aliphatic hydrocarbons and ethers.

When the photosensitive compound (A) is produced by the reaction between the isocyanate group-containing quinonediazide compound with the hydroxyl-containing compound, the isocyanate group-containing quinonediazide compound used in the reaction is obtained in the same way as in the production of the photosensitive compound (A) except that the hydroxyl-containing quinonediazide compound and the polyinocyanate compound are reacted at a ratio of about 2 moles of the isocyanate group per mole of hydroxyl. The polyisocyanate is preferably a polyisocyanate having two or more isocyanate groups different in reactivity.

As the hydroxyl-containing compound to be reacted with the isocyanate group-containing quinonediazide compound, any compound will do if it contains one or more hydroxyls in a molecule and has a molecular weight of about 5,500 or less. Examples of the hydroxyl-containing compound are polyol compounds such as polyalkylene glycol and trimethylolpropane, hydroxyl-containing polyesters, hydroxyl-containing acrylic oligemers, phenolic resins, polyhydroxybenzophenones such a: 2,3,4-trihydroxybenzophenone, and their aldehyde condensates and ketone condensates. These hydroxyl-containing compounds may contain a carboxyl group or an amino group if required.

The reaction of the isocyanate group-containing quinonediazide compound with the hydroxyl-containing compound can generally be performed by maintaining them at a temperature of room temperature to about 80° C., preferably room temperature to about 60° C. for about 0.5 to 20 hours in the presence or absence of the above inert organic solvent.

The thus obtained photosensitive compound (A) is a compound having in a molecule, 1 or more, preferably on the average, 1.5 or more, and at most 5 quinone-diazidesulfone units represented by formula (I). The molecular weight of the photosensitive compound (A) is 6,000 or less, preferably 500 to 4,000. When the molecular weight exceeds 6,000, the compatibility with the acrylic resin (B) tends to decrease, worsening the stability of the coating.

Meanwhile, the acrylic resin (B) having the salt-forming group, used in this invention, includes an acrylic resin having a group capable of forming a salt by neutralization. Examples of the salt-forming group when the composition of this invention is used as an anionic electrodeposition coating are anion-forming groups such as a carboxyl group, a sulfonyl group and a phosphoric acid group. Above all, the carboxyl group is preferable. On the other hand, examples of the salt-forming group when the composition of this invention is used as a cationic electrodeposition coating are cation-forming groups such as an amino group, an ammonium salt group, a sulfonium group and a phosphonium salt group.

The acrylic resin (B) can be produced by, for example, polymerizing an unsaturated monomer mixture containing as an essential component the polymerizable unsaturated monomer having the above salt-forming group by the usual radical copolymerization method, or polymerizing an unsaturated monomer including an epoxy group-containing polymerizable unsaturated monomer in like manner, and then adding the epoxy group in the resin together with the amino compound or reacting the resulting substance with onium salt-forming compounds such as tertiary amino compounds and acids to form the onium salt.

Regarding the polymerizable unsaturated monomer used to produce the acrylic resin (B), examples of the anion-forming group-containing unsaturated monomer are (meth)acrylic acid, crotonic acid, itaconic acid, itaconic anhydride, maleic acid, maleic anhydrida, fumaric acid and 2-hydroxyethyl acrylate acid phosphate. Examples of the cation-forming group-containing unsaturated monomer are aminoethyl (meth)acrylate, N-tert-butylaminoethyl (meth)acrylate, N,N-dimethylaminoethyl (meth)acrylate, N,N-diethylaminoethyl (meth)-acrylate, N,N-dimethylaminopropyl (meth)acrylate and N,N-dimethylaminobutyl (meth)acrylate.

Examples of the epoxy group-containing unsaturated monomer are glycidyl (meth)acrylate, glycidyl (meth)acrylamide and allylglycidyl ether.

Examples of the other polymerizable unsaturated monomer which is optionally used are $C_1$–$C_{26}$ alkyl or cycloalkyl esters of acrylic or methacrylic acid such as methyl (meth)acrylate, ethyl (meth)acrylate, n-brtyl (meth)acrylate, i-butyl (meth)acrylate, tert-butyl (meth)acrylate, cyclohexyl (meth)acrylate, 2-ethylhexyl (meth)acrylate, lauryl (meth)acrylate and stearyl (meth)acrylate; hydroxyalkyl (meth)acrylates such as 2-hydroxyethyl (meth)acrylate and 2-hydroxypropyl (meth)acrylate acrylamides or methacrylamides such as (meth)acrylamide, N-methyl (meth)acrylamide, diacetoneacrylamide, N-methylol (meth)acrylamide and N-butoxy-methylacrylamide; and vinyl monomers such as styrene, vinyl toluene, vinyl propionate, alpha-methylstyrene, vinyl acetate, (meth)acrylonitrile, vinyl propionate, vinyl pivalate and Veoba monomer (a product of Shell Chemical Co.).

The copolymerization of the above monomers is normally carried out by reacting a mixture of the above monomers in a suitable organic solvent in the presence of a radical-polymerizable initiator such as azobisisobutyronitrile or benzoyl peroxide at a temperature of about 30° to 180° C., preferably about 60° to 120° C., for a solvents, especially alcohols and ethers, used in electrodeposition paints are suitable as the organic solvent. Examples include methanol, ethanol, n-propanol, Isopropanol, butanol, ethylene glycol, butyl Cellosolve, ethyl Cellosolve, diethylene glycol, methylcarbitol, ethylene glycol dimethyl ether, and diethylene glycol dimethyl ether.

The amount of the salt-forming group in the acrylic resin (B) of this invention is generally 0.3 to 4.5 moles, preferably 0.5 to 1.6 moles/kg based on the total amount of the photosensitive compound (A) and the acrylic resin (B). If the amount of the salt-forming group is less than 0.3 mole/kg, it is difficult to make the resin water-soluble or water-dispersible, and an electrodeposition coating composition is difficult to prepare from the resin. If, on the other hand, it excess 4.5 moles/kg, it is difficult to coat the resulting electrodeposition paint on a substrate.

The acrylic resin (B) used in this invention generally may have a number average molecular weight of 3,000 to 100,000, preferably 5,000 to 30,000. If the number average molecular weight is lower than 3,000 a coated film prepared from the resin during electro-deposition tends to be broken and frequently, a uniform coated film cannot be obtained. If, on the other hand, it is higher than 100,000, the smoothness and levelness of the electrodeposited film are degraded and the coated surface tends to become uneven. Consequently, the resolution of line images tends to be reduced.

A mixing ratio of the photosensitive compound (A) to the acrylic resin (B) in the positive-type photosensitive electrodeposition coating composition in this invention is not strictly limited, but is generally adjusted such that the amount of the quinonediazidesulfone unit of formula (I) contained in the photosensitive compound (A) is 5 to 60 parts by weight, preferably 10 to 50 parts by weight, per 100 parts by weight of the acrylic resin (B).

If the amount of the unit of formula (I) is less than 5 parts by weight, the amount of carboxyl given when the formed coating is exposed to light is generally too small, making hard the development with a weak alkali. Meanwhile, if it is larger than 60 parts by weight, the glass transition temperature of the formed coating goes high and the coating tends to be hard and brittle. Consequently, as adhesion to the substrate is decreased or cracks occur in the coating during development and etching, break of the obtained line images is liable to occur. Moreover, since permeability of actinic energy rays such as ultraviolet rays, etc. are decreased, the irradiation dose has to be disadvantageously as high as 1,000 mj/cm² for pattern formation.

The electrodeposition coating composition in this is obtained such that when the acrylic resin; (B) contains the anionic group, it is neutralized with an amine or alkali compound and when the acrylic resin (B) contains the cationic group, it is neutralized with an organic or inorganic acid, and then dispersed or dissolved in water. When the cationic group is a quaternary ammonium salt group, a quaternary phosphonium salt group or a sulfonium salt, it can also be dispersed or dissolved in water as such. Examples of the neutralizing agent used include alkanolamines such as monoethanolamine, diethanolamine and triethanolamine, alkylamines such as triethylamine, diethylamine, monoethylamine, diisopropylamine, trimethylamine and diisobutylaxine, alkylalkanolamines such as dimethylaminoethanol, alicyclic amines such as cyclohexylamine, alkali metal hydroxide such as sodium hydroxide and potassium hydroxide, ammonia, and acids such as acetic acid, lactic acid, hydrochloric acid and phosphoric acid. They may be used either singly or as a mixture.

A hydrophilic solvent may be added to the electrodeposition coating composition in order to increase the flowability of the water-solubilized or water-dispersed electrodeposition paint further. Examples of the hydrophilic solvent are isopropanol, n-butanol, t-butanol, methoxyethanol, ethoxyethanol, butoxyethanol, diethylene glycol methyl ether, dioxane and tetrahydrofuran. Generally, the amount of the hydrophilic solvent used is desirably not more than 300 parts by weight per 100 parts by weight of the mixture of compound (A) and the resin (B).

To increase the amount of the coating composition coated on the substrate, a hydrophobic solvent may also be added to the composition. Examples of the hydrophobic solvent include petroleum solvents such as toluene and xylene, ketones such as methyl ethyl ketone and methyl isobutyl ketone, esters such as ethyl acetate and butyl acetate, and hydrophobic alcohols such as 2-ethylhexyl alcohol). Usually, the amount of the hydrophobic solvent is desirably not more than 200 parts by weight per 100 parts by weight of the above mixture.

As required, other resins may be incorporated to adjust the properties of the electrodeposited film. It is also possible to add a dye or a pigment.

The positive-type photosensitive electrodeposition coating composition obtained in this invention has the following characteristics, for example.

(1) The photosensitive compound (A) having higher hydrophobic nature than the acrylic resin (B) is mixed with said resin (B), so that the compound (A) is easily incorporated into the acrylic resin particles to reduce the probability that quinonediazide easily decomposable by bases contacts the bases. This is safer than in the case of introducing the quinonediazide group into the resin, and the photosensitivity little changes in the long-term electrodeposition coating.

(2) The amount of the photosensitive group can easily be adjusted only by changing the mixing ratio of the acrylic resin to the photosensitive compound. Consequently, the photosensitivity and the resolution of the resist film can easily be changed, and the resist composition be freely designed according to the high density of the circuit plate pattern and the production line speed.

Production of the printed wiring substrate using the positive-type electrodeposition coating composition in this invention is performed as follows.

In an electrodeposition coating bath (a solids content in the bath: 3 to 30 % by weight) is dipped a printed wiring substrate (e.g. a copper-clad plate) as an anode in the anionic electrodeposition coating or as a cathode in the cationic electrodeposition coating. A DC current of 20 to 400 V is passed. The suitable passing time is 30 seconds to 5 minutes. The film thickness is 2 to 100 micrometers, preferably 3 to 20 micrometers as a dry film thickness.

After the electrodeposition coating, the coated product is withdrawn from the electrodeposition bath, and washed with water, followed by removing the moisture contained in the electrodeposited film with hot air, etc.

Subsequently, the surface of the thus formed photosensitive electrodeposited film is irradiated with actinic rays such as ultraviolet rays via a pattern mask (positive). As the ortho-quinonediazide compound in the exposed portion becomes a carboxylic acid via a ketene, it is removed by the developing treatment with a developer such as an alkali aqueous solution, making it possible to realize a high resolution.

The actinic light used for exposure in this invention preferably has a wavelength of 3000 to 1500 Å. Sources of this light are, for example, solar light, a mercury lamp, a xenone lamp and an arc light. Irradiation of the actinic light is carried out usually in an irradiation dose of 50 to 800 mj/cm², preferably 50 to 500 mj/cm².

The developing treatment is carried out by spraying weakly alkaline water against the surface of the coated film to wash away the exposed portions of the coated film. The weakly alkaline water may be, or example, sodium hydroxide, potassium hydroxide, sodium silicate, sodium carbonate or aqueous ammonia having pH of 8 to 12, which neutralizes the free carboxylic acid in the coated film to make it water-soluble.

The metal portion (non-circuit portion) exposed on the substrate by the development is removed by an ordinary etching treatment using a ferric chloride, copper chloride solution or alkaline etching solution, for example. Then, the unexposed coated film on the circuit pattern is removed by dissolving with a Cellosolve-type solvent such as ethyl Cellosolve and ethyl Cellosolve acetate, an aromatic hydrocarbon solvent such as toluene and xylene, a ketone-type solvent such as methyl ethyl ketone and methyl isobutyl ketone, an acetate-type solvent such as ethyl acetate and butyl acetate, or a chlorine-type solvent such as trichloroethylene, or also with a sodium hydroxide or potassium hydroxide aqueous solution of pH 11 or more in the case of using an anionic electrodeposition paint, or also with an organic acid such as acetic acid or lactic acid in the case of using a cationic electrodeposition paint.

The positive-type photosensitive electro-deposition coating composition can be easily coated on a electrically conductive materials such as copper foil by electrodeposition, and the electrodeposited film is dried to form a uniform photosensitive film. When light is irradiated onto the photosensitive film through a positive film, the exposed portion changes as described above and is developed with weakly alkaline water. The unexposed portion can also be removed by dissolving with the solvent, alkali solution (in the case of using the anionic paint) or the acid (in the case of using the cationic paint). Accordingly, this can supersede conventional photosensitive films.

The electrodeposition coating composition of this invention is particularly suitable for the production of a printed circuit board having through-holes. This composition obviates a soldering step unlike the case of using a photosensitive dry film, and shortens the process of producing the printed circuit board. With a photocurable negative-type electrodeposition paint, it is difficult to form a cured film on through-holes of small diameters. In contrast, since the unexposed portion remains as a resist film in the present inventor, the composition of this invention is suitable for the production of printed circuit board having through-holes of a small diameter.

Using the composition in this inventor, the printed wiring substrate having landless through-holes can easily be produced by exposure via a circuit pattern mask designed so as not to shade the light from the through-hole portion.

In the positive-type photosensitive electro-deposition coating composition of this invention, the photosensitive material with the quinonediazide group incorporated through the less hydrolyzable sulfonamide or sulfonimide and urethane linkage is used. It is higher in hydrophobic nature than the acrylic resin used in this invention. When the aqueous dispersion is therefore formed, the photosensitive material is incorporated into the dispersion particles and it is less likely to directly contact water, amines and acids that expedite hydrolysis. Consequently, it does not happen that agglomeration or precipitation in the bottom of the bath occurs in the electrodeposition coating bath over a long period of time and a coating voltage greatly changes. Thus, the stability of the electrodeposition coating bath is high, permitting the easy handling and controlling.

The following Examples illustrate this invention in more detail. Parts and percentages in Examples are all by weight.

PRODUCTION EXAMPLE 1

| | parts | |
|---|---|---|
| 2-Methoxypropanol | 450 | I |
| n-Butyl acrylate | 692 | II |
| Styrene | 200 | |
| Acrylic acid | 108 | |
| t-Butylperoxy octoate | 50 | |
| 2-Methoxypropanol | 50 | III |
| t-Butylperoxy octoate | 10 | |

The solvent I was charged into a flask and heated to 110° C. The mixture II was added dropwise at 110° C. for 3 hours, and the temperature was kept at 110° C. for 1 hour. Subsequently, the mixture III was added dropwise at 110° C. for 1 hour and the temperature of 110° C. was further kept for 2 hours to afford an acrylic resin solution 1 having a solids content of 67 %, a number average molecular weight of 11,000 and an acid value of 84.

PRODUCTION EXAMPLES 2 To 5

In the same manner as in Production Example 1, acrylic resin solutions 2 to 5 were produced according to the formulation shown in Table 1.

TABLE 1

| | | 2 | 3 | 4 | 5 |
|---|---|---|---|---|---|
| Solvent I | Butyl Cellosolve | 450 | | | 400 |
| | 2-Methoxypropanol | | 300 | | |
| | Methyl diglyme | | | 450 | |
| | n-Butanol | | | | 100 |
| | i-Propanol | | 150 | | |

TABLE 1-continued

| | | 2 | 3 | 4 | 5 |
|---|---|---|---|---|---|
| Mixed solution II | n-Butyl acrylate | 643 | 222 | | 629 |
| | n-Butyl methacrylate | | 400 | 750 | |
| | Methyl methacrylate | | 200 | | 100 |
| | 2-Hydroxyethyl methacrylate | | 50 | 100 | |
| | Styrene | 200 | | | 200 |
| | Glycidyl methacrylate | | | | 71 |
| | t-Butylperoxy octoate | | | 80 | |
| | Azobisisobutyronitrile | 80 | | | |
| | Benzolyl peroxide | | 60 | | 50 |
| | Dimethylaminoethyl methacrylate | 157 | | | |
| | Acrylic acid | | 128 | 100 | |
| | Methacrylic acid | | | 50 | |
| Mixed solution III | Butyl Cellosolve | 50 | | | 50 |
| | Dimethyl diglyme | | | 50 | |
| | i-Propanol | | 50 | | |
| | t-Butylperoxy octoate | | | 5 | |
| | Azobisisobutyronitrile | 10 | | | |
| | Benzoyl peroxide | | 5 | | 10 |
| Properties | Reaction temperature | 100° C. | 100° C. | 120° C. | 100° C. |
| | Solids content | 67% | 67% | 67% | 67% |
| | Number average molecular weight | 8,500 | 12,000 | 7,000 | 14,000 |
| | Acid value | — | 100 | 110 | — |
| | Amine value | 56 | — | — | — |

PRODUCTION EXAMPLE 6

A flask was charged with 1,550 parts of the acrylic resin solution 5 obtained in Production Example 5, and heated at 40° C. While keeping the temperature at 40° C., a mixed solution of 44.5 parts of dimethylaminoethanol and 30 parts of acetic acid was added dropwise over the course of 30 minutes, and the mixture was maintained at 60° C. for 5 hours. There resulted an acrylic resin solution 6 having a solids content of 66 % and a quaternary ammonium salt content of 0.46 mole/kg.

PRODUCTION EXAMPLE 7

A flask was charged with 1,550 parts of the acrylic resin solution 5 and heated at 60° C. Wile keeping the temperature at 60° C., a mixed solution of 61 parts of thioglycol and 45 parts of lactic acid was added dropwise over the course of 30 minutes, and then maintained at 80° C. for 5 hours. There was obtained an acrylic resin solution 7 having a solids content of 67 % and a tertiary sulfonium salt content of 0.45 mole/kg.

PRODUCTION EXAMPLE 8

A flask was charged with 100 parts of the acrylic resin solution 4, and a solution of 18.7 parts of 1,2-naphthoquinonediazide-5-sulfonyl chloride in 360 parts of acetone was added thereto. While stirring the mixture at 30° C., 10 parts of triethylamine was added dropwise over the course of 1 hour. After the resulting mixture was maintained at 30° C. for 2 hours, the reaction product was added dropwise to 5,000 parts of deironized water which was being stirred, over the course of 1 hour. The aqueous layer was separated and dried at 40° C. under reduced pressure. Thereafter, 40 parts of dimethyl diglyme was added and dissolved to obtain an acrylic resin solution having a solids content of 67 % and an acid value of 89.

PRODUCTION OF A HYDROXYL-CONTAINING OTHER-QUINONEDIAZIDE COMPOUND 1

A four-necked flask was charged with 269 parts of ortho-naphthoquinonediazidesulfonyl chloride and 1345 parts of dioxane, and with stirring at room temperature, 50 parts of N-methylethanolamine was added dropwise over hour. After the dropwise addition, the mixture was stirred further for about 3 hours. After determining that the absorption of the amino group near 3300 cm$^{-1}$ in the IR spectrum of the reaction mixture disappeared, the reaction was terminated.

The resulting solution was put in deodorize water, and the quaternary amine which trapped hydrochloric acid formed during the reaction was removed. The product was then extracted with isobutyl acetate, and the solvent was evaporated. The residue was dried in a desiccator under reduced pressure to give a hydroxyl-containing ortho-quinonediazide compound 1.

PRODUCTION OF A HYDROXYL-CONTAINING ORTHO-QUINONEDIAZIDE COMPOUND 2

A four-necked flask was charged with 269 parts of ortho-naphthoquinonediazidesulfonyl chloride and 1345 parts of dioxane, and with stirring at room temperature, 22 parts of monoethanolamine was added over the course of 1 hour. After the dropwise addition, the mixture was further stirred for about 3 hours, and then worked up as in the production of the quinonediazide compound 1. As a result, a hydroxyl-containing ortho-quinonediazide compound 2 was obtained.

PRODUCTION OF A PHOTOSENSITIVE COMPOUND 1

A four-necked flask was charged with 307 parts of a hydroxyl-containing quinonediazide compound 1, 500 parts of dimethyl diglyme and 3 parts of dibutyltin dilaurate, and heated at 60° C. with stirring. To this mixture was added 185 parts of an aliphatic polyisocyanate ("Takenate D-165N": a tradename for a product of Takeda Chemical Industries, Ltd., an isocyanate content of 22.7 %, a number average molecular weight of about 650) over the course of 30 minutes, and the reaction was performed at 60° C. until absorption of the isocyanate group near 2250 cm$^{-1}$ in the IR spectrum disappeared. Subsequently, dimethyl diglyme was distilled off to the solids content of 60 % at 60° C. under reduced pressure. There was obtained a photosensitive compound 1 containing ,7.4 % of quinonediazidesulfone units (about 3.5 units/molecule) and having a number average molecular weight of 1,700.

PRODUCTION OF A PHOTOSENSITIVE COMPOUND 2

A four-necked flask was charged with 294 parts of the hydroxyl-containing quinonediazide compound 2, 300 parts of dimethyl diglyme and 1 part of dibutyltin diacetate, and they were heated at 60° C. with stirring. To the mixture was added a solution of 135 parts of 4,4-diphenylmethane diisocyanate ("Millionate MR200": a tradename for a product of Nippon Polyurethane K.K., an isocyanate content of 22.7 % and a number average molecular weight of about 650) in 300 parts of acetone over the course of 30 minutes, and the reaction was performed under reflux until absorption of the isocyanate group near 2250 cm$^{-1}$ in the IR spectrum disappeared. The solvent was then distilled off to the solids content of 60 % under reduced pressure to obtain a photosensitive compound 2 containing 54.3 % of quinonediazidesulfone units (about 2.6 units/molecule) and having a number average molecular weight of about 1,150.

PRODUCTION OF A PHOTOSENSITIVE COMPOUND 3

|  | parts |  |
|---|---|---|
| Dimethyl diglyme | 1,100 | I |
| m-Isopropenyl-alpha,alpha-dimethylbenzyl isocyanate | 402 | |
| n-Butyl acrylate | 598 | II |
| t-Butylperoxy octoate | 100 | |
| t-Dodecyl mercaptan | 10 | |

The solvent I was charged into a flask and heated to 110° C. The mixture II was added dropwise at 130° C. over the course of 3 hours. The temperature was kept at 110° C. for 3 hours to obtain an acrylic resin having a solids content of 50 % and a number average molecular weight of 3,100. This solution was then cooled to 60° C., and 614 parts of the hydroxyl group-containing quinonediazide compound 1 and 614 parts of dimethyl diglyme were added, and the reaction was run until absorption of the isocyanate group near 2250 cm$^{-1}$ in the IR spectrum disappeared. There resulted a photosensitive compound 3 containing 28.7 % of quinonediazidesulfone units (about 4.6 units/molecule) and having a number average molecular weight of about 3,700.

EXAMPLE 1

Hundred parts of the acrylic resin solution 1 obtained in Production Example 1 was mixed with 10.5 parts of triethylamine and 7 parts of butyl carbitol for neutralization. Subsequently, 25 parts of the photosensitive compound 1 was added and they were well mixed. While stirring the mixture by a high-speed mixer at a stirring rate of 1,000 to 2,000 rpm, 880 parts of deionized water was gradually added to obtain a stable dispersion. Said dispersion had the solids content of 8 % and pH of 7.8. The amount of quinonediazidesulfone units was 10.6 parts per 100 parts of the acrylic resin.

EXAMPLES 2 TO 7 AND COMPARATIVE EXAMPLES 1 AND 2

In the same way as in Example 1, dispersions were obtained in accordance with the formulation shown in Table 2.

TABLE 2

|  | Example |  |  |  |  |  | Comparative Example |  |
|---|---|---|---|---|---|---|---|---|
|  | 2 | 3 | 4 | 5 | 6 | 7 | 1 | 2 |
| Acrylic resin-2 | 100 | | | | | | | |
| Acrylic resin-3 | | 100 | | | | | 100 | |
| Acrylic resin-4 | | | 100 | | | 100 | | |
| Acrylic resin-6 | | | | 100 | | | | |
| Acrylic resin-7 | | | | | 100 | | | |
| Acrylic resin-8 | | | | | | | | 100 |

TABLE 2-continued

|  | Example | | | | | | Comparative Example | |
|---|---|---|---|---|---|---|---|---|
|  | 2 | 3 | 4 | 5 | 6 | 7 | 1 | 2 |
| Benzyl alcohol |  | 5 |  |  | 5 | 5 |  | 5 |
| Acetic acid | 4.5 |  |  |  |  |  |  |  |
| Triethylamine |  | 12.6 | 12.8 |  |  | 12.6 | 8.8 | 12.6 |
| Photosensitive compound-1 | 60 |  | 50 | 70 |  |  |  |  |
| Photosensitive compound-2 |  | 35 |  |  | 100 |  |  |  |
| Photosensitive compound-3 |  |  |  |  |  | 50 |  |  |
| Photosensitive *compound-4 |  |  |  |  |  |  |  | 15 |
| Deionized water | 1,123 | 702 | 638 | 920 | 1,065 | 657.4 | 561 | 687 |
| Bath solids content (%) | 8 | 10 | 12 | 10 | 10 | 10 | 10 | 10 |
| pH | 7.2 | 7.6 | 7.8 | 8.2 | 7.8 | 7.6 | 7.6 | 7.5 |
| Quinonediazide-sulfone units (parts) | 25.5 | 17.0 | 21.0 | 29.7 | 48.6 | 10.8 | 23.9 | 22.4 |

*2,3,4-Trihydroxybenzophenone tri-1,2-naphthoquinone-diazide-5-sulfonate
solids content: 100%
quinonediazidesulfone units: 75.2% (about 3.0 units/molecule)

A two-sided circuit plate for printed wiring board with a copper thickness of 35 microns obtained by subjecting an insulated plate having through-holes 0.4 mm in diameter to electroless copper plating and electrolytic copper plating was dipped in the aqueous dispersion of 25° C. obtained in each of Examples 1 to 7 and Comparative Examples 1, 3–4 and 7. Said plate was used as an anode in each of Examples 1 and 3 and Comparative Examples 1 and 2 and as a cathode in each of Examples 2 and 5–6, and was connected with the opposite pole dipped in the aqueous dispersion. After the electrodeposition was carried out under fixed electricity passage conditions shown in Table 3, the circuit plate was washed with water and dried at 80° C. for 5 minutes. The electro-deposited films were all free from pinholes and lad the uniform thickness. The insides of the through-holes were completely coated.

These aqueous dispersions were stored at 30° C. for 6 months. As a result, the appearance remained unchanged in Examples 1 to 7, but in the dispersions in Comparative Examples 1 and 2, the precipitation of the resin was observed. Especially in Comparative Example 1, said precipitation was heavy.

Moreover, after the dispersions were stored at 30° C. for 6 months, the above experiment was repeated. As a result, in Examples 1 to 7, the films were free from pinholes and had the uniform thickness, and the insides of the through-holes were completely coated. However, in Comparative Examples 1 and 2, the abnormal resin precipitation was partially observed, the thickness was nonuniform and pinholes occurred around the through-holes.

TABLE 3

|  | Example | | | | | | | Comparative Example | |
|---|---|---|---|---|---|---|---|---|---|
|  | 1 | 2 | 3 | 4 | 5 | 6 | 7 | 1 | 2 |
| Electro-deposition coating conditions | Fixed current 50 mA/cm$^2$ 120″ | Fixed voltage 60 V 120″ | — 60 V 100″ | Fixed current 35 mA/cm$^2$ 180″ | Fixed voltage 40 V 120″ | Fixed current 35 mA/cm$^2$ 120″ | Fixed current 70 V 100″ | Fixed current 50 mA/cm$^2$ 120″ | Fixed voltage 60 V 100″ |
| Film thickness | 10μ | 8μ | 10μ | 8μ | 11μ | 8μ | 10μ | 10μ | 10μ |
| Film thick-thickness (retesting after 6-month storage) | 9μ | 8μ | 10μ | 8μ | 10μ | 8μ | 9μ | Abnormal precipitation | — |

To the resulting film was closely adhered a positive-type mask, and both surfaces were exposed to light under the exposure conditions shown in Table 4. Thereafter, development, etching and removal of the resin film were conducted under the predetermined conditions shown in Table 4. The resulting circuit patterns were observed by an electron microscope and found to be complete circuit patterns having a circuit width (conductor width) of 30 micrometers. The unexposed through-hole portion remained completely without undergoing the copper etching to secure passage of both surfaces.

Moreover, the same experiment was repeated on the films obtained from the baths stored at 30° C. for 6 months. Consequently, in Examples 1-7, the circuit patters were as good as those before storage. However, in Comparative Examples 1 and 2, breakage of the circuit ascribable to the undissolved portion of the film in the exposed portion in the development, breakage of the circuit due to pinholes and lack of passage of through-holes frequently occurred, and good circuit patterns could not be obtained.

TABLE 4

| | Example | | | | | | | Comparative Example | |
|---|---|---|---|---|---|---|---|---|---|
| | 1 | 2 | 3 | 4 | 5 | 6 | 7 | 1 | 2 |
| Exposure conditions (80 V high-pressure mercury lamp) mj/cm² | 150 | 300 | 200 | 300 | 300 | 300 | 200 | 300 | 300 |
| Developer | 2% Sodium meta-silicate | 2% Sodium carbonate | 1.5% Sodium meta-silicate | 2% Sodium carbonate | 2% Sodium meta-silicate | 2% Sodium meta-silicate | 2% Sodium meta-silicate | 2% Sodium meta-silicate | 2% Sodium meta-silicate |
| Developing temperature | 40° C. | 40° C. | 30° C. | 40° C. | 30° C. | 40° C. | 35° C. | 40° C. | 40° C. |
| Developing time | 100" | 100" | 100" | 100" | 100" | 100" | 150" | 100" | 100" |
| Etching | Ferric chloride solution | Ammoniacal alkali etching solution | Ferric chloride solution | Ferric chloride solution | Ammoniacal alkali etching solution | Ammoniacal alkali etching solution | Ammoniacal alkali etching solution | Ferric chloride solution | Ferric chloride solution |
| Peel-off of film | 3% Sodium hydroxide | 3% Hydrochloric acid aqueous solution | 3% Sodium hydroxide | Methylene cloride | 3% Hydrochloric acid aqueous solution | 3% Hydrochloric acid aqueous solution | 2% Sodium meta-silicate | 3% Sodium hydroxide | Methylene chloride |
| Temperature | 50° C. | 30° C. | 50° C. | 25° C. | 30° C. | 30° C. | 50° C. | 50° C. | 25° C. |

We claim:

1. A positive-type photosensitive electrodeposition coating composition comprising
   (A) a photosensitive compound having a molecular weight of less than 6,000 and containing at least one modified quinonediazidesulfone units represented by the following formula (I)

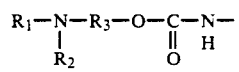

wherein
$R_1$ represents

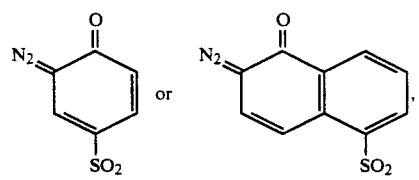

$R_2$ represents a hydrogen atom, an alkyl group, a cycloalkyl group or an alkyl ether group, and
$R_3$ represents an alkylene group, a cycloalkylene group or an alkylene ether group,
in the molecule and
   (B) an acrylic resin having a salt-forming group.

2. The composition of claim 1 in which $R_2$ is an alkyl group having 1 to 6 carbon atoms.

3. The composition of claim 2 in which $R_2$ is a methyl group.

4. The composition of claim 1 in which $R_3$ is a linear alkylene group having 2 to 6 carbon atoms.

5. The composition of claim 1 in which the modified quinonediazidesulfone units represented by formula (I) is obtained by the reaction of the polyisocyanate compound with a hydroxyl-containing quinonediazide compound represented by the following formula

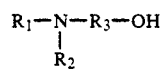

wherein $R_1$, $R_2$ and $R_3$ are as defined.

6. The composition of claim 5 in which the hydroxyl-containing quinonediazide compound is selected from

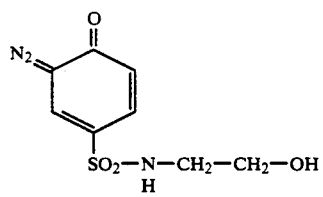

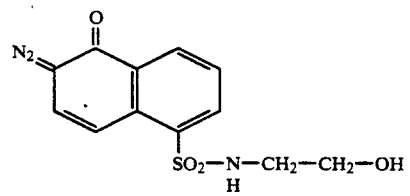

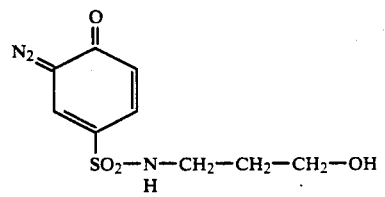

-continued

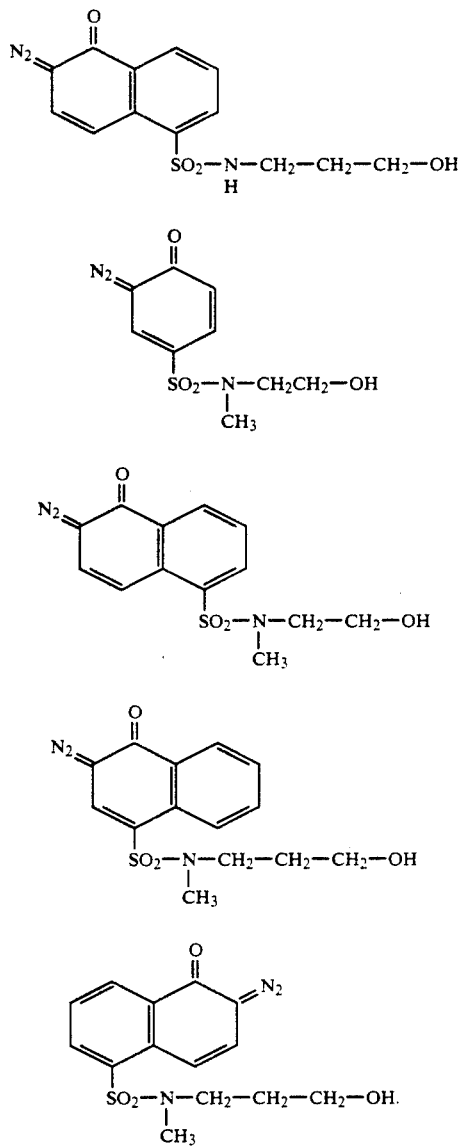

7. The composition of claim 1 in which the photosensitive compound contains 1 to 5, on the average, of the modified quinonediazidesulfonic acid unit represented by formula (I) in a molecule.

8. The composition of claim 1 in which the photosensitive compound has a molecular weight of less than 4,000.

9. The composition of claim 1 in which the acrylic resin (B) has an anionic group selected from a carboxyl group, a sulfonyl group and a phosphoric acid group.

10. The composition of claim 1 in which the acrylic resin (B) has a cationic group selected from an amino group, an ammonium salt group, a sulfonium group and a phosphonium salt group.

11. The composition of claim 1 in which the acrylic resin (B) has 0.3 to 4.5 moles/kg of the salt-forming group based on the total amount of the photosensitive compound (A) and the acrylic resin (B).

12. The composition of claim 1 in which the acrylic resin (B) has a number average molecular weight of 3,000 to 100,000.

13. The composition of claim 1 in which a mixing ratio of the photosensitive compound (A) to the acrylic resin (B) is adjusted such that the amount of the quinonediazidesulfone unit of formula (1) contained in the photosensitive compound (A) is 5 to 60 parts by weight, per 100 parts by weight of the acrylic resin (B).

14. The composition of claim 1 which further comprises not more than 300 parts by weight, per 100 parts by weight of the mixture of the compound (A) and the acrylic resin (B), of a hydrophilic solvent.

15. The composition of claim 1 which further comprises not more than 200 parts by weight, per 100 parts by weight of the mixture of the compound (A) and the acrylic resin (B), of a hydrophobic solvent.

16. A process for producing a circuit plate, which comprises:
(i) a step of coating the electrodeposition coating composition in claim 1 on a surface of a circuit substrate having an electrically conductive coating to form a positive-type photosensitive coating,
(ii) a step of exposing the positive-type photosensitive coating to light through a pattern mask,
(iii) a step of removing the photosensitive coating in the exposed portion to form an etching pattern,
(vi) a step of removing the exposed electrically conductive coating by etching, and
(v) a step of removing the photosensitive coating on the circuit pattern.

* * * * *